Aug. 27, 1968 R. A. WOLFF 3,399,276

RC COUPLED TRANSISTOR AMPLIFIER

Filed April 28, 1965

Inventor
Robert A. Wolff
By Nicholas D. Camasto
Atty.

3,399,276
Patented Aug. 27, 1968

1

3,399,276

RC COUPLED TRANSISTOR AMPLIFIER

Robert A. Wolff, Lombard, Ill., assignor to Admiral Corporation, Chicago, Ill., a corporation of Delaware Filed Apr. 28, 1965, Ser. No. 451,545
6 Claims. (Cl. 179—1)

ABSTRACT OF THE DISCLOSURE

A low cost, line operated, transformerless phono amplifier capable of substantial audio power output in which the load resistor for the outpᵘt transistor also serves as a voltage dropping resistor between the power supply and the transistor. The speaker is capacitively coupled to the output of the transistor thus eliminating the need for an output transformer.

*Disclosure*

This invention relates in general to amplifiers and in particular to transistor amplifiers. Specifically, the invention concerns the construction of a novel, low cost, good fidelity, relatively high output transistor amplifier.

The advent of the transistor has caused the vacuum tube to rapidly "giveway" in electronic applications where heat or space is a problem. In the last few years the transistor has substantially penetrated the so-called high fidelity market and has been predominant in low cost phono applications. It is to this latter category that this invention is particularly directed.

It must be understood that the term "low cost" is not used in a derogatory sense. It generally refers to size and portability features. Unquestionably in this market one of the prime considerations is the number of component parts that must be utilized in the unit to effect an acceptable minimum level of performance, since cost is directly related to the number of components utilized. The types of components used are also important from both a cost and a performance viewpoint. In vacuum tube amplifiers, for example, it has been necessary to incorporate an output transformer (a high cost-poor performance component) in order to match the relatively high output impedance of the vacuum tube to the low impedance of the speaker. A power transformer is often required (but by no means essential) to provide for the various operating votlages desired. While the transistor is in theory independent of output transformers, it has generally been necessary to employ them, especially in low cost applications where exotic output circuits are not resorted to. Even the requirement of a power transformer of substantial size has not been eliminated. In fact, in many transistor amplifiers the power supply arrangements are complex and expensive.

With the teachings of the invention, it is feasible to build a low cost transistor amplifier which does not require any transformers and which utilizes a minimum of expensive components. It should be noted that elimination of the output transformer has the laudable effect of improving frequency response since the output transformer has generally been the weakest link in the frequency response chain. In addition to being relatively expensive, output transformers are generally heavy and bulky and inefficient in terms of signal transformation efficiency.

Accordingly the princpial object of this invention is to provide a novel, low cost transistor amplifier.

A further object of this invention is to provide a novel, low cost transistor amplifier which does not utilize any transformers.

2

Another object of this invention is to provide a transformerless transistor amplifier having a speaker and a blocking capacitor serially connected in its output whereby only signal currents flow through the speaker.

A still further object of this invention is to provide a low cost RC coupled transistor amplifier which utilizes a single multi-tapped resistor and a single multi-section electrolytic capacitor.

Other objects of this invention will be readily apparent to those skilled in the art upon a reading of the following description in conjunction with the drawings in which.

Figure 2:
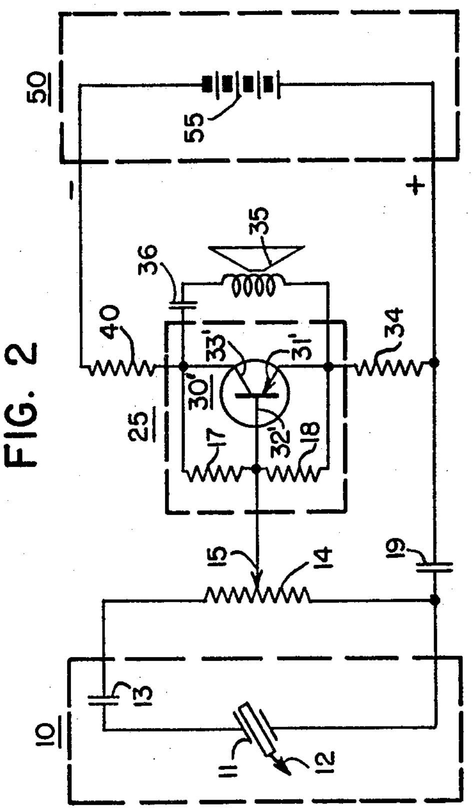
FIG. 2 is a simplified schematic diagram equivalent of the preferred circuit which more readily lends itself to explanation.
Figure 2A:
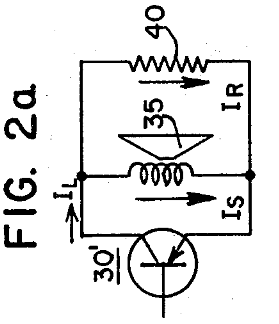

And FIG. 2*a* is a further simplified portion of the schematic diagram of FIG. 2.

Figure 1:
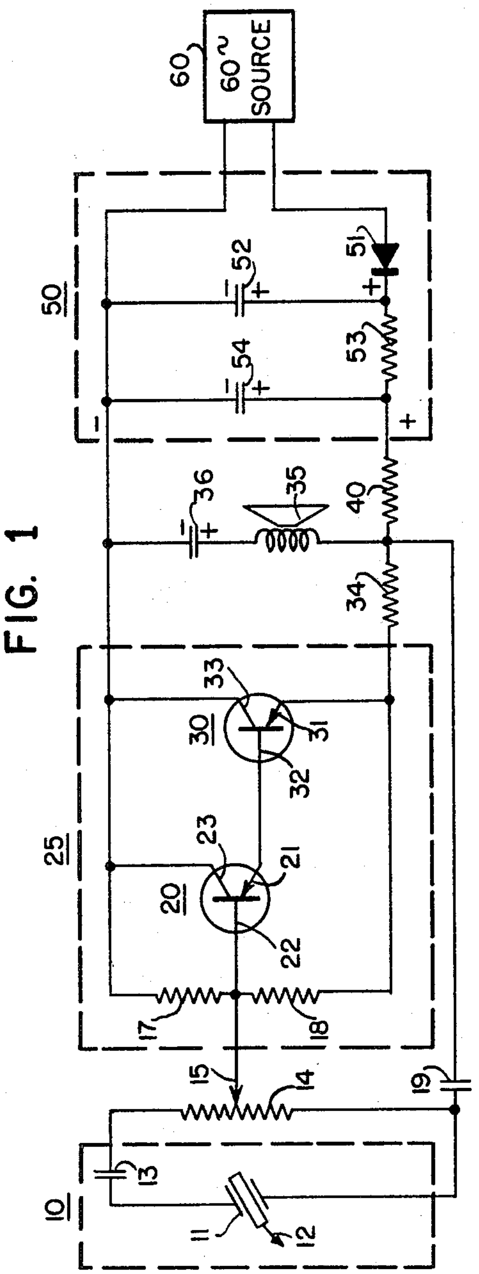
FIG. 1 is a schematic diagram of the preferred circuit of the invention.

Referring now to FIG. 1, there is shown a conventional phonograph cartridge 11, having a record engaging stylus 12, which is coupled across and input potentiameter or level control having a fixed resistance element 14 and a slider 15 movable thereacross. A capacitor 13 is shown interconnecting one end of cartridge 11 with the potentiometer, this capacitor merely being used to represent the equivalent circuit of the cartridge. As is well known, stylus 12 engages the playing groove of a record (not shown) and is mechanically moved by undulations therein. This mechanical movement is translated into an electrical signal by the phono cartridge element. The cartridge and capacitor are enclosed in a dashed line block 10 which should be understood to represent a signal source. It is obvious that any other appropriate signal source may be substituted for the components shown in block 10 with equal facility.

A further dashed line block 25 is utilized to depict a transistor amplifier comprising a transistor 20 and a transistor 30. Transistor 20 has an emitter 21, a base 22 and a collector 23, whereas transistor 30 has an emitter 31, a base 32, and a collector 33. Emitter 21 is directly connected to base 32 and collector 23 is connected to collector 33. A bias network, comprising a pair of resistors 17 and 18 is connected between collector 23 and emitter 31, with the junction of the resistors being connected to base 22 of transistor 20 and also to slider 15 on the level control.

A resistor 34 has one terminal connected to emitter 31 and the other terminal returned, through a capacitor 19, to the bottom of the level control. Thus the input signal from source 10 is connected to the transistor amplifier between slider 15 and the junction of resistor 34 and capacitor 19.

Moving to the right of the drawing, a block 60 is labeled 60 cycle source and represents a conventional household line circuit. A rectifier 51 is connected in one wire emanating from the source and feeds a first electrolytic filter capacitor 52. A filter resistor 53 and a further electrolytic filter capacitor 54 are connected across capacitor 52. The combination of capacitors 52 and 54 and resistor 53 forms a well known arrangement for filtering ripple currents from rectified current waveforms. The entire combination of the capacitor, resistor and rectifier is included in a dashed line block, indicated by the reference numeral 50, which should be understood to comprise any conventional DC power supply, including a simple battery supply.

The negative lead from the power supply is connected to the junction of the transistor collectors. The positive lead of the power supply is connected to a resistor 40, which in turn is connected to the junction of resistor 34 and capacitor 19. A dynamic loudspeaker 35 and an electrolytic capacitor 36 are connected between the last mentioned junction and the negative lead from the power supply.

The circuit outlined above functions as a normal Class A type amplifier for amplifying electrical signals received from source 10 and for feeding such amplified signals to loudspeaker 35 where they are converted into acoustic energy. However, since the diagram of FIG. 1 depicts the preferred form of the invention, it incorporates certain circuit arrangements which, while helpful from a cost standpoint, detract from a ready description thereof. Consequently a simplified form of this circuit is redrawn as FIG. 2 and will be used for explanation of the invention.

Initially it should be noted that the amplifier of FIG. 1 comprises a two stage direct coupled transistor unit, which for all practical purposes may be treated as a single composite transistor having a different set of characteristics from either of the individual transistors. This is indicated in the simplified diagram of FIG. 2 by amplifier 25 having a single transistor 30'. DC power supply 50 has been replaced for simplicity by a battery 55 having a plus and a minus terminal. Signal source 10 remains the same and feeds the fixed element 14 on the level control, the signal being taken from the slider 15 thereon. As redrawn, it will be readily seen that resistor 40 constitutes the DC load for transistor 30' and is connected between the negative terminal of the battery and collector 33' of the composite transistor. Base bias is derived by the voltage divider formed by the series combination of resistor 40, 17', 18' and 34 connected across the battery terminals. The input signal is coupled across base 32' and emitter resistor 34. Resistor 34 will be recognized as a signal degenerating resistor which however raises the input impedance of the transistor. The major signal current load for transistor 30' comprises loudspeaker 35 and capacitor 36.

The circuit arrangement of FIG. 2 is believed to be much more familiar to those skilled in the art and will readily be seen to depict a standard transistor amplifier circuit with the notable exception of the RC coupled output, that is the interconnection of the load resistor and the output circuit of the transistor.

Signals from source 10 are applied across the base-emitter circuit of transistor 30' and give rise to signal currents in the collector-emitter circuit thereof. The amplified signal currents are RC coupled to the loudspeaker and result in a translation thereof into acoustical energy. It should be particularly noted that capacitor 36 prevents DC current from flowing through loudspeaker 35. Resistor 40 serves as a voltage dropping resistor for providing proper operating potentials to transistor 30' and also functions as the amplifier stage load resistance. Voltage variations are developed across resistor 40 in accordance with current flowing therethrough. With respect to signal currents, resistor 40 is connected in parallel with capacitor 36 and loudspeaker 35 so that signal currents flow therethrough in accordance with their respective impedances. The DC current path appears obvious since capacitor 36 effectively blocks the loudspeaker, resistors 40 and 34 are in a series circuit with the collector-emitter junction of transistor 30' and battery 55.

In FIG. 2*a* an equivalent circuit for the transistor, loudspeaker and load resistor, for signal frequencies only, is shown. Resistor 34 has been neglected since it is utilized only to provide signal degeneration with consequent increase in transistor input impedance. Capacitor 36 has been removed since it is effectively a short circuit at signal frequencies, as is true of battery 55. Consequently, for signal frequencies, it is seen that loudspeaker 35 and load resistor 40 are connected in parallel across the emitter-collector path of transistor 30'. If the emitter-collector current is $I_1$, the current through the speaker $I_s$ and the current through resistor 40, $I_r$, it will be readily apparent that the currents $I_s$ and $I_r$ will be proportioned as a function of the impedances of the respective paths.

A system with vary good signal efficiency may be attained by making resistor 40 much larger than the speaker impedance. Naturally, however, the power loss in resistor 40 increases, but this is not signal power. Lower signal efficiency is obtained with a smaller ratio of load resistor to speaker impedance along with lower power loss in the resistor. The particular ratio used will, of course, depend upon the design parameters of the individual application.

The description of the circuit of FIG. 2 fits exactly the operation of the circuit of FIG. 1 in which the power supply has been detailed and the load resistor moved in its series circuit to adjoin resistor 34 (and the power supply filter resistor). In the preferred form of the invention it will be seen that electrolytic capacitors 36, 52 and 54 have been arranged to have a common negative terminal. Consequently these capacitors may constitute a single, multi-section, conventional type electrolytic capacitor currently available on the market. It will be further noted that resistors 34, 40 and 53 are serially connected in FIG. 1 and consequently these units may also be combined in a single, tapped resistor. Due to the currents involved these resistors will generally be of the power type. Transistors 20 and 30 are conventional with transistor 30 being of the power type. The interconnection of these two transistors is well known in the art under the term "Darlington Connection." It is recognized that a single transistor having appropriate characteristics may readily be substituted for this combination of transistors indicated.

As in all transistor circuits, the transistor types may be readily changed with appropriate changes in voltage polarities. In the preferred embodiment PNP type transistors are used. Also, the particular type of input signal source is a matter of choice, as is the choice of loudspeaker impedance to load resistance ratio.

What has been described is a simple low cost transistor amplifier arrangement which may advantageously be operated directly from the power line and which does not require an output transformer. It is recognized that numerous modifications in the circuit arrangement set forth as the preferred embodiment of the invention may be made without departure from its true spirit and scope. The invention is limited only as defined in the claims.

The embodiments of the invention in which an exclusive property or privilege is claimed are defined as follows:

1. A transformerless transistor amplifier adapted for operation from a conventional source of household alternating current comprising: a power supply including a rectifier and filter arrangement for converting the current from said household source into direct current; a dynamic speaker, a transistor having an input circuit adapted to receive electrical signals and an output circuit; means including a direct current blocking capacitor connecting said output circuit to said dynamic speaker, said capacitor allowing only signal frequencies to pass to said speaker; and a combination load and direct current voltage dropping resistor connecting said output circuit and said power supply whereby substantial signal energy may be transferred from said output circuit to said speaker without necessitating the interposition of an impedance matching transformer.

2. A phono amplifier as set forth in claim 1 wherein said input circuit includes an emitter-base path of said transistor and said output circuit includes an emitter-collector path of said transistor; and a small unbypassed resistance in said input path for providing a degree of signal degeneration, thereby increasing the input impedance of said transistor.

3. A transformerless transistor phono amplifier adapted for operation from a conventional source of household current comprising; a diode rectifier, a first electrolytic capacitor and a filter resistor connected to a source of household current and deriving a direct current power supply; a photograph cartridge; a level control coupled across said photograph cartridge; a transistor amplifier having an input circuit coupled to said level control and an output circuit; a dynamic speaker; a second electrolytic capacitor coupling said dynamic speaker with said output circuit for signal frequencies only; and a combined DC voltage dropping and load resistor interconnecting said power supply and said output circuit whereby proper DC operating potential for said transistor amplifier is obtained and substantial audio power may be supplied to said dynamic speaker without necessitating an output transformer.

4. A phono amplifier as set forth in claim 3 wherein said transistor has emitter, base and collector electrodes; said input circuit including said emitter and said base electrodes and said output circuit including said emitter and said collector electrodes; and a small unbypassed resistor connected in both said input circuit and said output circuit to thereby increase the input impedance of said transistor.

5. A phono amplifier as set forth in claim 4 wherein said second electrolytic capacitor in circuit with said speaker and said first electrolytic capacitor in the filter comprise a single multisection electrolytic capacitor.

6. A phono amplifier as set forth in claim 5 wherein said filter resistor and said combined voltage dropping and load resistor comprise a single multitapped resistance element.

References Cited

UNITED STATES PATENTS

| | | | |
|---|---|---|---|
| 2,694,185 | 11/1954 | Kodama | 317—242 XR |
| 2,857,462 | 10/1958 | Lin | 179—1 |
| 3,015,695 | 1/1962 | Claras et al. | 179—1 |
| 3,244,995 | 4/1966 | Barditch et al. | 330—22 XR |

KATHLEEN H. CLAFFY, *Primary Examiner.*

R. P. TAYLOR, *Assistant Examiner.*